United States Patent [19]
Morita et al.

[11] Patent Number: 5,307,034
[45] Date of Patent: Apr. 26, 1994

[54] ULTRATHIN MULTIMODE QUARTZ CRYSTAL FILTER ELEMENT

[75] Inventors: Takao Morita; Osamu Ishii; Takebumi Kurosaki, all of Kanagawa, Japan

[73] Assignee: Toyo Communication Equipment Co., Ltd., Samukawa, Japan

[21] Appl. No.: 809,511

[22] PCT Filed: Nov. 22, 1990

[86] PCT No.: PCT/JP90/01528
 § 371 Date: Jan. 24, 1992
 § 102(e) Date: Jan. 24, 1992

[87] PCT Pub. No.: WO91/19352
 PCT Pub. Date: Dec. 12, 1991

[30] Foreign Application Priority Data
 May 25, 1990 [JP] Japan ............................ 2-136135

[51] Int. Cl.$^5$ ............................................. H03H 9/56
[52] U.S. Cl. ............................ 333/187; 310/321; 310/366; 310/367
[58] Field of Search ............................ 333/187–192; 310/320, 321, 366, 367

[56] References Cited

U.S. PATENT DOCUMENTS 5,075,651 12/1991 Pradal ............................ 333/187

FOREIGN PATENT DOCUMENTS 48-83752 11/1973 Japan .
51-35297 3/1976 Japan .
51-97494 8/1976 Japan .
243008 10/1991 Japan ............................ 333/190
9112663 8/1991 PCT Int'l Appl. ............ 333/187

Primary Examiner—Benny Lee
Attorney, Agent, or Firm—Fish & Richardson

[57] ABSTRACT

Since split electrodes are disposed along the x-axis of an AT cut quartz crystal plate on its ultrathin vibratory portion formed integrally with a thick frame-like marginal portion surrounding it, desired acoustic coupling can be obtained although the split electrodes are disposed closely to such an extent as not to cause shorting between them. It is therefore possible to obtain, with a satisfactory yield, filter elements which have center frequencies in the range greater than about ten megahertz and sufficiently wide passbands.

1 Claim, 3 Drawing Sheets

ULTRATHIN MULTIMODE QUARTZ CRYSTAL FILTER ELEMENT

TECHNICAL FIELD

The present invention relates to a multimode quartz crystal filter element using an ultrathin AT cut quartz crystal substrate which is capable of oscillation at high frequencies greater than about ten megahertz through fundamental vibration.

BACKGROUND ART

A quartz crystal plate to be used for a conventional ordinary AT cut quartz crystal resonator is flat, and hence the highest fundamental frequency obtainable for practical use is around 40 MHz from present manufacturing techniques and mechanical strength. On this account there has been widely employed what is called overtone oscillation means which extracts a higher order harmonic mode vibration of an AT cut quartz crystal resonator to obtain a frequency which is an odd multiple of the fundamental resonance frequency, but its oscillation circuit requires for an LC tuning circuit including a coil and hence is not suitable for fabrication as an IC, besides the overtone oscillation circuit may sometimes be difficult to maintain at a stable oscillation because a resonator to be included in the overtone oscillator has a large capacitance ratio and consequently a high impedance level. On the other hand, a surface acoustic wave (SAW) resonator, whose resonant frequency is determined by the pitch of electrode fingers of an interdigital transducer, is able to resonate at a maximum of 1 GHz or so due to the progress in photolithography, but a piezoelectric substrate when used as the surface acoustic wave resonator is remarkably inferior to the AT cut quartz crystal in terms of temperature-frequency characteristic. To solve this problem, there has been proposed and is now under study an ultrathin piezoelectric resonator which has a cavity provided, by etching or mechanical grinding, in one side or in both sides of a block of AT cut quartz crystal to form an ultrathin vibratory portion surrounded with a support frame so that the fundamental resonant frequency may extend from ten megahertz to hundreds of megahertz while retaining the mechanical strength of the vibratory portion.

By fabricating a multimode filter element using such an ultrathin piezoelectric substrate as above, a filter with a center frequency in the range from about ten to about 100 megahertz could be easily obtained without utilizing the overtone techniques.

Incidentally, as regards a conventional multimode piezoelectric filter element, it is said to be preferable that when the center frequency of the filter is 10 MHz, the thickness of an electrode to be evaporated onto the piezoelectric substrate should be about 3000 Å so there is entrapping or confinement of the vibration energy at an appropriate value and an ohmic loss which is sufficiently low. The mass of electrodes is one of the parameters in the analysis of the confinement of vibration energy, and the equivalent thickness of electrode films is defined as the sum of the thicknesses of the select films formed on both sides of the quartz crystal substrate to calculate the mass of electrodes. Here, this definition of the thickness of electrode films is employed.

On the other hand, in the case where a filter element which has a center frequency of 100 MHz and is similar to the above-mentioned filter element in the vibration energy entrapping characteristic and other basic characteristics is manufactured using an ultrathin AT cut quartz crystal plate, the electrode should be vapor-deposited to a thickness of 300 Å, i.e. 1/10 of the above-said value. However, it is evident that such an electrode thickness is so small that the ohmic loss will increase, making it impossible to obtain a sufficient attenuation of the filter.

If the thickness of the electrode is set to around 1000 Å to keep the ohmic loss sufficiently low, the electrode is too thick as compared with the thickness of the AT cut quartz crystal substrate (about 17 μm), and consequently, the amount of vibration energy entrapped or confined becomes excessive and satisfactory acoustic coupling between the electrodes cannot be obtained unless the inter-electrode gap is reduced by a large amount accordingly, the passband width of the filter inevitably becomes very small. If the inter-electrode gap is reduced to such an extent as to provide desired acoustic coupling so as to avoid the above-noted problem, a highly accurate mask is needed for vapor deposition of the electrodes, besides the possibility of shorting between the divided electrodes increases, making it virtually impossible to manufacture a filter of a passband wide enough for practical use.

In addition, substantially no studies have been made so far as to what method should be used to obtain desired acoustic coupling between electrodes disposed closely to such an extent as not to cause shorting therebetween in the case of employing such a resonator as a multimode filter, partly because the resonator has been confined to studies in laboratories and has not been mass-produced.

The present invention is based on the fact that in the case of making a multimode filter element by forming split electrodes on an ultrathin AT cut quartz crystal plate as mentioned above, the passband of the filter element varies substantially with the direction of alignment of the electrodes, and it is an object of the invention to provide an ultrathin multimode quartz filter crystal element which is capable of obtaining desired acoustic coupling between electrodes in close proximity without causing shorting therebetween and thus is well suited for practical use.

SUMMARY OF THE INVENTION

To attain the above objective, in the ultrathin multimode quartz crystal filter element of the present invention the split electrodes are disposed in the crystallographic x-axis orientation of an AT cut quartz crystal block forming the filter element. The term "crystallographic axis" as used herein refers to the standard crystallographic x, y, and z axes identification of crystal structure as would be well understood by one skilled in the art.

DETAILED DESCRIPTION OF THE INVENTION

Figure 1A:
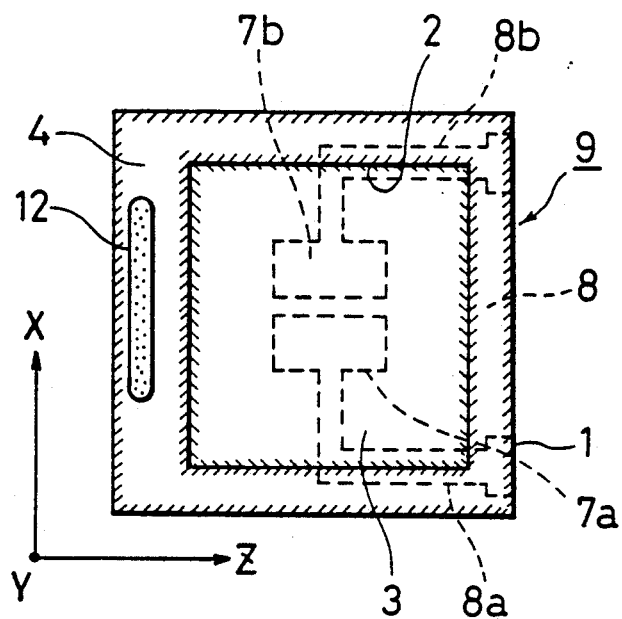
FIGS. 1(a) and 1(b) are plane views illustrating different embodiments of the ultrathin multimode quartz crystal filter element according to the present invention.

The present invention will hereinafter be described in detail with reference to its embodiments shown in the drawings.

To facilitate a better understanding of the present invention, a brief description will be given of an ultrathin piezoelectric resonator studied so far.

Figure 3A:
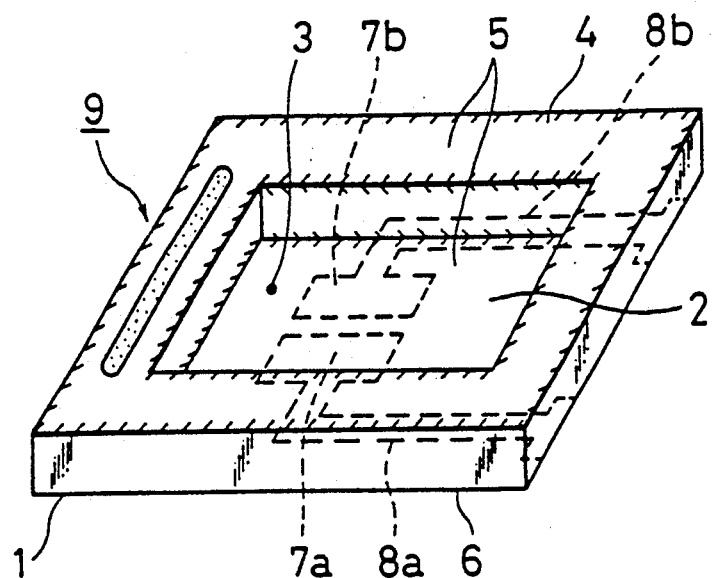
FIGS. 3(a) and 3(b) are perspective and sectional views showing the construction of a conventional ultrathin piezoelectric multimode filter.
Figure 3B:
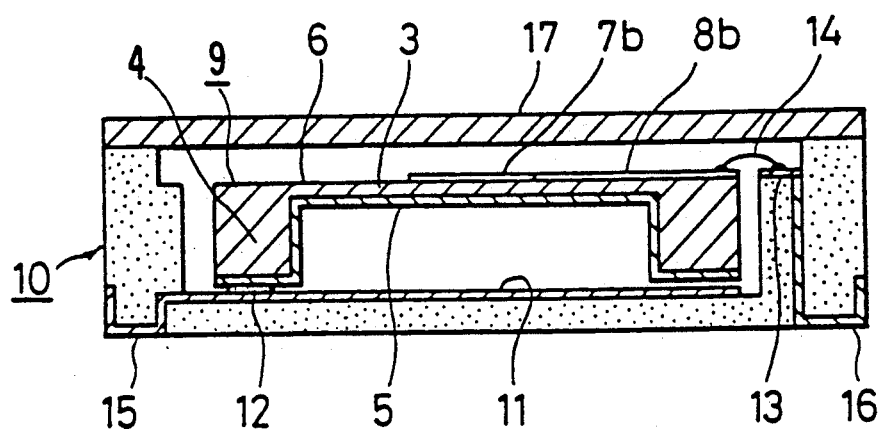

FIGS. 3(a) and 3(b) are a perspective view showing the construction of an ultrathin piezoelectric multimode filter studied heretofore and a sectional view showing the state in which the filter element is fixedly mounted in a case. The filter element has a cavity 2 formed by mechanical grinding or etching in one side of a block 1 of quartz crystal or similar piezoelectric material substantially centrally thereof so that the bottom of the cavity 2 forms a very thin vibratory portion 3 which is supported by a thick frame-like marginal portion 4 (see FIG. 3(a)) formed integrally therewith.

A conductive film is evaporated onto the surface of the frame-like marginal portion 4, the inner wall surface of the cavity and the surface of the vibratory portion 3 to form an overall electrode 5 on the side of the piezoelectric block 1 where the cavity 2 is provided. Further, a pair of split electrodes 7a and 7b and electrode lead portions 8a and 8b extending therefrom to and along marginal edges of the block are provided on the flat surface 6 thereof opposite from the overall electrode 5. The conventional ultrathin multimode piezoelectric filter element, indicated generally by 9, has such a construction.

It is advisable, in view of its structural feature as shown in FIG. 3(b), that the filter element of this type be fixedly mounted upside down—with the cavity 2 facing downward—in a so-called flat type case 10 which is a dish-like molding of an insulator. Usually, in this instance one portion of the frame-like marginal portion 4 deposited with the overall electrode 5 and a conductive film 11 coated all over the bottom of the case 10 are bonded in only one edge of the marginal portion 4 and fixed to each other by a conductive adhesive 12 and the electrode lead portions 8a {not shown in FIG. 3(b)} and 8b extending from the split electrodes 7a {not shown in FIG. 3(b)} and 7b on the opposite side from the cavity 2 are each connected by a bonding wire 14 to a conductive film 13 coated on a stepped portion on the inner wall of the case 10, thereby reducing the restriction of the filter element 9 by the case 10 as much as possible and minimizing distortion which is applied to the filter element due to the difference in the coefficient of thermal expansion between them.

The conductive films 11 and 13 on the bottom of the case 10 and on the stepped portions on the inner wall of case 10 are electrically connected to external lead terminals 15 and 16 which hermetically pass through the case 10 and are exposed on the outside thereof. Such a piezoelectric device is completed by hermetically sealing the opening of the case 10 with a proper lid 17 (usually made of metal) after the resonator is fixedly mounted in the case 10.

Also in the filter element of the type described above the degree of acoustic coupling between the split electrodes 7a and 7b appreciably varies according to the direction of their alignment with respect to the crystal axis of the quartz crystal plate used, as in conventional quartz crystal multimode filter elements.

Figure 2A:
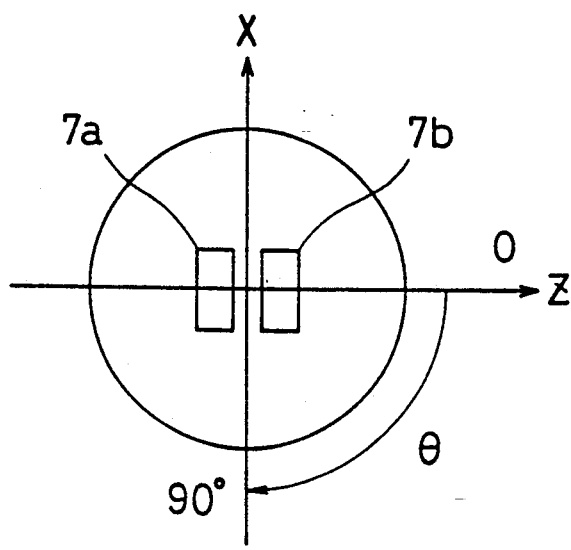
FIGS. 2(a) and 2(b) are a diagram showing the relationship between the crystal axis of a quartz crystal plate and the direction of alignment of split electrodes and a graph showing experimental results about the degree of acoustic coupling obtained by changing the above-mentioned relationship.
Figure 2B:
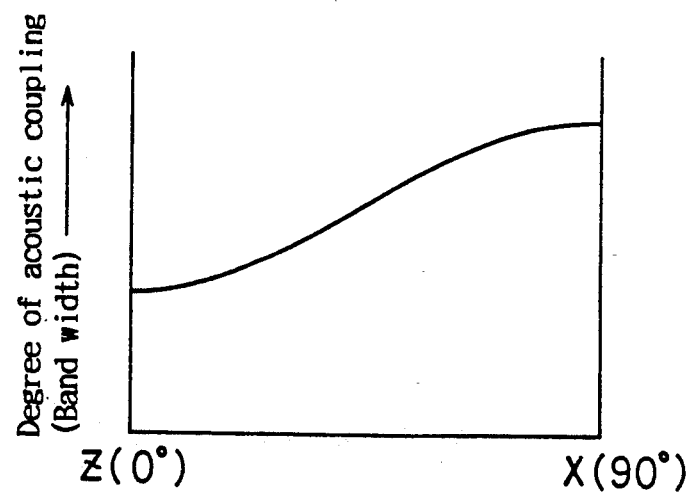

FIGS. 2(a) and 2(b) shows the relationship between the direction of alignment of the split electrodes with respect to the x-axis of the AT cut quartz crystal plate and the degree of acoustic coupling between the electrodes, i.e. the bandwidth of the filter.

FIG. 2(a) illustrates the definition of the direction of alignment of the split electrodes 7a and 7b in the present invention. The x-axis and z-axis in FIG. 2(a) indicate the directions of the x and z crystallographic axes of the quartz crystal plates, respectively.

FIG. 2(b) shows the relationship between the direction of alignment of the split electrodes and the degree of acoustic coupling, or bandwidth, in the present invention.

As is evident from FIGS. 2(a) and 2(b), the bandwidth of the quartz filter element varies about 1.26 times between the z-direction coupling by the alignment of the split electrodes 7a and 7b in the z-axis direction and the x-direction coupling by their alignment in the x-axis direction.

FIG. 2(a) is a diagram which gives a definition of the direction of alignment or orientation, $\theta$, of the split electrodes 7a and 7b, and in which reference characters "X" and "Z" denote the directions of the crystal axes X and Z of the quartz crystal plate, respectively.

In FIG. 2(a) it is assumed that the direction of alignment $\theta$ of the electrodes 7a and 7b is 0° when they are disposed along the z-axis. Accordingly, when the electrodes 7a and 7b are disposed along the x-axis, their direction of alignment $\theta$ is 90°.

FIG. 2(b) is a graph showing the relationship between the direction of alignment $\theta$ of the split electrodes 7 and 7b and the degree of acoustic coupling between them, that is, the bandwidth of the filter, the abscissa representing the direction of alignment $\theta$ of the split electrodes.

Since the conventional multimode piezoelectric filter element usually employs a quartz crystal plate of a fundamental frequency of 30 MHz at the lowest, and of 50 MHz at the highest, however, there is no need of using the structure which provides the acoustic coupling in the x-direction.

Figure 1B:
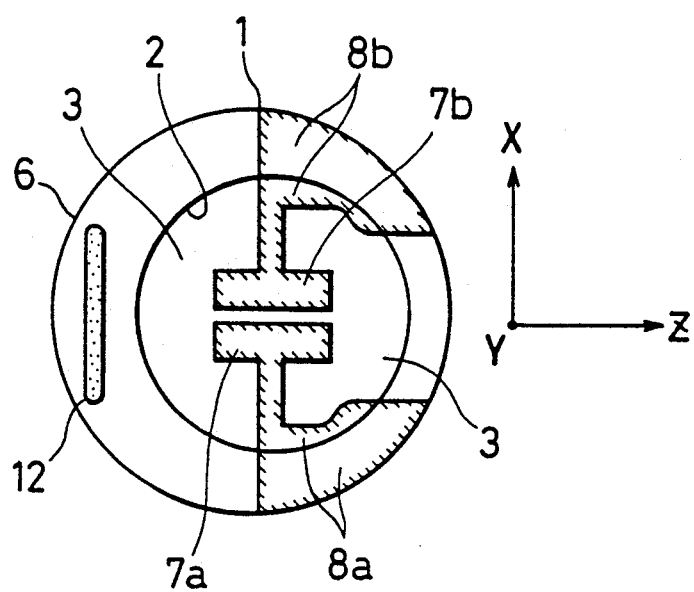

On the other hand, multimode quartz crystal filter elements shown in FIGS. 1(a) and 1(b) each use a quartz crystal plate of about 100 MHz fundamental vibration, and in this instance, the manufacture of such filter elements with a satisfactory bandwidth through utilization of the conventional z-direction coupling will not work properly in the formation of the split electrodes as referred to previously.

In the ultrathin multimode quartz crystal filter element according to the present invention, the split electrodes are aligned in x-axis direction, that is, the x-direction coupling which essentially provides a wide bandwidth is utilized.

The multimode quartz crystal filter element depicted in FIG. 1(a) uses an AT cut quartz crystal substrate for the piezoelectric block 1 and has a construction in which the substrate is covered with a conductive film on the side where the cavity 2 is provided and the split electrodes 7a and 7b are aligned in the x-axis direction on the opposite side of the ultrathin vibratory portion 3.

The circular multimode filter element shown in FIG. 1(b) uses an AT cut quartz crystal substrate for the piezoelectric block 1 and has the split electrodes 7a and 7b aligned in the x-axis direction on the bottom of the cavity 2 and the overall electrode formed all over the substrate on the opposite side therefrom.

The parts indicated by the other numerals in FIGS. 1(a) and 1(b) are the same as those indicated by the same numerals in FIGS. 3(a) and 3(b), and therefore the description of those parts are omitted. X, Y, and Z in the Figures indicate the directions of the X, Y, and Z crystallographic axes of the quartz crystal plate, respectively.

Such constructions as mentioned above allow ease in mass production of multimode quartz crystal filter elements which have electrodes thick enough to secure conductivity and electrode spacing which does not introduce any particular difficulty in fabrication and which have very high center frequencies and hence possess sufficient bandwidth.

Although the embodiments have been described only in connection with the case where a rectangular block of quartz crystal is used as the substrate and the split electrodes are provided on the vibratory portion on the side where the cavity is provided, the present invention need not be limited specifically thereto; for example, the quartz crystal block 1 may be disc-shaped as shown in FIG. 1(b) and the split electrodes 7a and 7b may also be vapor deposited on flat portion 6 of the block along the x-axis.

With the present invention described above, it is possible to obtain desired acoustic coupling, even if the split electrodes are spaced wide apart to such an extent as not to cause shorting therebetween-this permits the fabrication of a filter element with a sufficiently large bandwidth. Hence, the present invention is remarkably effective in satisfying various characteristics of the multimode quartz crystal filter which employs a quartz crystal substrate of a fundamental frequency above 50 MHz and in improving the yield rate of product.

We claim:

1. An ultrathin multimode quartz crystal filter element having a fundamental frequency of at least 50 Mhz., comprising:

an AT cut quartz crystal plate having an identifiable crystallographic x-axis and including an ultrathin vibratory portion and a thick frame-like marginal portion integral therewith for supporting said ultra-thin vibratory portion; and split electrodes disposed on said vibratory portion along the crystallographic x-axis of said quartz crystal plate.

* * * * *